(12) United States Patent
Rosich et al.

(10) Patent No.: US 12,101,245 B2
(45) Date of Patent: *Sep. 24, 2024

(54) SYSTEM AND METHOD FOR MULTI-PATH MESH NETWORK COMMUNICATIONS

(71) Applicant: NORTHROP GRUMMAN SYSTEMS CORPORATION, Falls Church, VA (US)

(72) Inventors: Garrett Rosich, San Diego, CA (US); Peter Houser, Poway, CA (US); Bob Caulfield, Rancho Sante Fe, CA (US); Matthew Houser, San Diego, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/219,169

(22) Filed: Jul. 7, 2023

(65) Prior Publication Data

US 2023/0353488 A1 Nov. 2, 2023

Related U.S. Application Data

(63) Continuation of application No. 16/919,859, filed on Jul. 2, 2020, now Pat. No. 11,729,092.

(51) Int. Cl.
*H04L 45/24* (2022.01)
*H03M 13/11* (2006.01)
(Continued)

(52) U.S. Cl.
CPC ........... *H04L 45/24* (2013.01); *H03M 13/114* (2013.01); *H03M 13/1515* (2013.01); *H03M 13/1525* (2013.01); *H04L 69/326* (2013.01)

(58) Field of Classification Search
CPC .... H04L 45/24; H04L 69/326; H03M 13/114; H03M 13/1515; H03M 13/1525;
(Continued)

(56) References Cited

U.S. PATENT DOCUMENTS 7,310,537 B2   12/2007   Wichman et al.
7,885,354 B2   2/2011    Perlman et al.
(Continued)

OTHER PUBLICATIONS

Zongjie TU, et al., "Overview of LDPC Codes", Seventh International Conference on Computer and Information Technology, Department of Computer and Information Technology Fudan University, Shanghai, China, downloaded on May 21, 2020 at 17:59:26 UTC from IEEE Xplore, pp. 469-474 (6 sheets).
(Continued)

*Primary Examiner* — Michael K Phillips
(74) *Attorney, Agent, or Firm* — KATTEN MUCHIN ROSENMAN LLP

(57) ABSTRACT

The disclosed invention provides system and method for multi-path mesh network communications. The network system utilizes multiple communication paths and linearly encoded and disassembled packets through mathematical coding techniques that respectively travel the communication paths. The system includes an encoder, a transmitter, a decoder and a receiver. The encoder receives data from an external source and linearly encodes and simultaneously disassembles the data to generate copackets. None of the individual copackets contain decodable information of the data. The transmitter is coupled to the multiple communication paths and respectively transmits the copackets through different communication paths. The receiver receives the copackets transmitted through the communication paths. The decoder decodes available copackets and reassembles the data from the available copackets if a number of the available copackets are no less than a math-
(Continued)

ematically calculated number. The reassembled data has the complete information of the data originally transmitted.

20 Claims, 12 Drawing Sheets

(51) Int. Cl.
*H03M 13/15* (2006.01)
*H04L 69/326* (2022.01)
(58) Field of Classification Search
CPC ......... H03M 13/1102; H03M 13/2957; H03M 13/373; H04W 40/22
See application file for complete search history.

(56) References Cited

U.S. PATENT DOCUMENTS

| | | | |
|---|---|---|---|
| 8,442,152 B2 | 5/2013 | Raleigh et al. | |
| 8,588,193 B1 | 11/2013 | Ho et al. | |
| 9,116,833 B1* | 8/2015 | Rakitzis | G06F 11/1076 |
| RE45,807 E | 11/2015 | Agee et al. | |
| 9,577,734 B2 | 2/2017 | Le Bars et al. | |
| 10,367,677 B2 | 7/2019 | Parkvall et al. | |
| 2002/0150041 A1 | 10/2002 | Reinshmidt et al. | |
| 2002/0159431 A1 | 10/2002 | Moulsley et al. | |
| 2003/0007218 A1 | 1/2003 | Mahlab | |
| 2004/0068647 A1 | 4/2004 | Hariharan et al. | |
| 2006/0059409 A1 | 3/2006 | Lee | |
| 2006/0215581 A1 | 9/2006 | Castagnoli | |
| 2012/0089889 A1 | 4/2012 | Gladwin | |
| 2013/0145236 A1 | 6/2013 | Baker | |
| 2013/0311848 A1 | 11/2013 | Purohit | |
| 2014/0204984 A1 | 7/2014 | Agee et al. | |
| 2015/0016610 A1 | 1/2015 | Verma et al. | |
| 2018/0139131 A1* | 5/2018 | Ignatchenko | H04L 47/32 |
| 2019/0041835 A1* | 2/2019 | Cella | G05B 19/4184 |
| 2019/0132033 A1 | 5/2019 | Akkarakaran et al. | |
| 2019/0349426 A1* | 11/2019 | Smith | H04L 67/104 |
| 2019/0363989 A1* | 11/2019 | Shalev | H04L 69/22 |
| 2019/0379485 A1 | 12/2019 | Jiang et al. | |
| 2022/0141752 A1 | 5/2022 | Miao | |

OTHER PUBLICATIONS

Cherkaoui, et al., "Packet Error Recovery via Multipath Routing and Reed-Solomon Codes in Underwater Networks", https://ieeexplore.ieee.org/document/6404927, 6 sheets.

Byers, et al., "A Digital Fountain Approach to Reliable Distribution of Bulk Data", May 18, 1998, http://citeseerx.ist.psu.edu/viewdoc/download?doi=10.1.1.53.9457&rep=rep1&type=pdf, 22 sheets.

Non-Final Rejection dated Jun. 23, 2022, from U.S. Appl. No. 16/919,859, 228 sheets.

Final Rejection dated Oct. 14, 2022, from U.S. Appl. No. 16/919,859, 226 sheets.

Notice of Allowance dated Mar. 30, 2023, from U.S. Appl. No. 16/919,859, 94 sheets.

* cited by examiner

SYSTEM AND METHOD FOR MULTI-PATH MESH NETWORK COMMUNICATIONS

CROSS REFERENCE TO RELATED APPLICATIONS

This application is a continuation application of U.S. patent application Ser. No. 16/919,859, filed on Jul. 2, 2020, which herein is incorporated by reference in its entirety.

BACKGROUND

A mesh network utilizes infrastructure nodes that connect directly, dynamically and non-hierarchically to as many other nodes as possible and cooperate with one another to efficiently route data from and to clients. Mesh networks dynamically self-organize and self-configure, which can reduce installation overhead. The ability to self-configure enables dynamic distribution of workloads, particularly in the event a few nodes should fail. This in turn contributes to fault-tolerance and reduced maintenance costs. However, current mesh networks have disadvantages in reliability and security too, because data containing complete information is transmitted through a single path formed between nodes and the path between nodes may be intercepted and exploited by an adversary.

Mesh networks are becoming more and more popular in commercial areas such as networked Wi-Fi routers, 5G base stations and Internet of Things communities. Mesh networks are also becoming prominent in military Tactical Airborne Networks such as mesh Multifunction Advanced Data Link (MADL). These data transmissions are prominent in directional, omnidirectional and wired communications.

The Internet of Things (IoT) is a system of interrelated computing devices with unique identifiers and the ability to transfer data over a network without requiring human-to-human or human-to-computer interaction. The IoT requires huge scalability in the network space to handle the surge of devices and the consumer, industrial, and even military data passing through the network. Data passing through the network must be resilient to adversaries attempting to intercept the data and reliable even when data passed through the large mesh may be lost.

Directional networks between users can be established by using, for example, directional antennas and appropriate waveforms to create the directional networks. Directional antennas or beam antennas are generally used for directional networking. A directional antenna radiates or receives greater power in specific directions allowing increased performance and reduced interference from unwanted sources. Directional antennas may provide increased performance over omnidirectional antennas in general when greater concentration of radiation in a certain direction is desired. Current directional networks essentially use a single path defined by a single beam. A transmitter aims a single beam at a receiver or aims a single beam at an intermediary for intra-network forwarding. Current directional communications, however, have disadvantages in reliability and security, and do not completely overcome the disadvantages of omnidirectional communications in reliability and security. For example, the beam between nodes in directional communications may fail due to various reasons, including geography and adversary actions. The beam between the transmitter and the receiver may be intercepted and exploited by an adversary. This vulnerability is mitigated by making the beam narrow, but that incurs other disadvantages.

SUMMARY

The disclosed invention provides systems and methods for more reliable and secure data transmissions in directional, omnidirectional and wired communications. A system and method of the disclosed invention utilizes multiple linearly encoded and simultaneously disassembled packets (referred to as "copackets") which are coded using mathematical algorithms, and utilize multiple communication paths that respectively transmit the copackets between a transmitter and a receiver. For example, plaintext data to be sent by the transmitter is first linearly encoded and simultaneously disassembled using a potential variety of linear encoders. The mathematical algorithms used to encode the plaintext data subsequently disassemble the packets into what we call copackets. These copackets independently do not represent any meaningful information as a certain number of these copackets are mathematically required in order to decode the codetext data into meaningful plaintext information. In one embodiment, the multiple paths may be achieved by mesh network schemes that include multiple nodes. In another embodiment, the multiple paths also may be achieved by multiple directional beams in directional communication networks. The copackets travel through the mesh or through the directional beams through many different paths before reaching the receiver. Embodiments of the system and method increase network resiliency in data transmission, because a data package can be transmitted from a transmitter to an intended recipient even if some of the multiple paths fail. Embodiments reduce the risk of packet interception because more than a mathematically determined amount of paths must be intercepted and the linear encoding scheme must be known in order to reassemble the original data packet(s).

These and others advantages may be provided by, for example, a network system for multi-path mesh network communications. The network system includes a first host and a second host. The first host includes an encoder that receives data from an external source and linearly encodes and simultaneously disassembles the data into encoded copackets to generate a plurality of copackets, and a transmitter coupled to a plurality of communication paths. None of the individual copackets contains useable information or the ability to decode any part of the data. The transmitter respectively transmits the copackets through different communication paths. The second host is coupled to the communication paths and includes a receiver that receives the copackets transmitted through the communication paths from the transmitter of the first host, and a decoder that decodes available copackets and reassembles the data from the available copackets if a number of the available copackets is no less than a mathematically preset number. The reassembled data has the complete information of the data originally transmitted.

The network system may further include a plurality of communication nodes that are coupled to the first and second hosts. The communication paths are formed by linking the communication nodes. The copackets may include address headers, and the copackets may be directed to communication nodes indicated by the address headers. The communication nodes may receive the copackets and relay the received copackets to the other communication nodes based on the address headers of the copackets. The transmitter may transmit the copackets via omnidirectional signals, directional signals, communication wires or combinations thereof, and the communication nodes may transmit the copackets via omnidirectional signals, directional signals, communication wires, or combinations thereof.

The communication paths may be formed by a plurality of directional beams directed toward the second host. The transmitter may emit the directional beams toward the second host, and the directional beams respectively carry the copackets. The transmitter may include a plurality of directional antennas. The directional beams may have different waveform characteristics from each other.

The encoder may encode the packets by using Reed Solomon codes, low density parity check codes, or turbo codes. The encoder may encode the packets by using a linear encoding algorithm that disassembles the packets before transmission. None of the copackets may be transmitted through the same communication path as other copackets. The data may be encoded in the Open Systems Interconnection (OSI) transport layer (layer 4).

These and others advantages may be provided by, for example, a method for performing multi-path mesh network communications. The method includes steps of supplying data to an encoder from an external source, encoding the data to generate a plurality of copackets where none of the individual copackets contains useable information of the data, transmitting the copackets to a recipient host through a plurality of communication paths where the copackets are respectively transmitted through different communication paths, receiving the copackets transmitted through the communication paths, and decoding available copackets to reassemble the data from the available copackets if a number of the available copackets is no less than a mathematically preset number. The reassembled data has the complete information of the data originally transmitted.

The communication paths may be formed by linking a plurality of communication nodes, and the communication nodes may receive the copackets and relay the received copackets to the other communication nodes based on address headers included in the copackets. Said transmitting of the copackets may include transmitting the copackets via omnidirectional signals, directional signals, communication wires, or combinations thereof. The communication paths may be formed by a plurality of directional beams, and said transmitting of the copackets may include emitting the directional beams, which respectively carry the copackets, toward the recipient host.

BRIEF DESCRIPTION OF THE DRAWINGS

The drawing figures depict one or more implementations in accord with the present concepts, by way of example only, not by way of limitations. In the figures, like reference numerals refer to the same or similar elements.

DETAILED DESCRIPTION

In this section, some embodiments of the invention will be described more fully with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will convey the scope of the invention to those skilled in the art. Like numbers refer to like elements throughout, and prime notation is used to indicate similar elements in alternative embodiments.

Figure 1A:
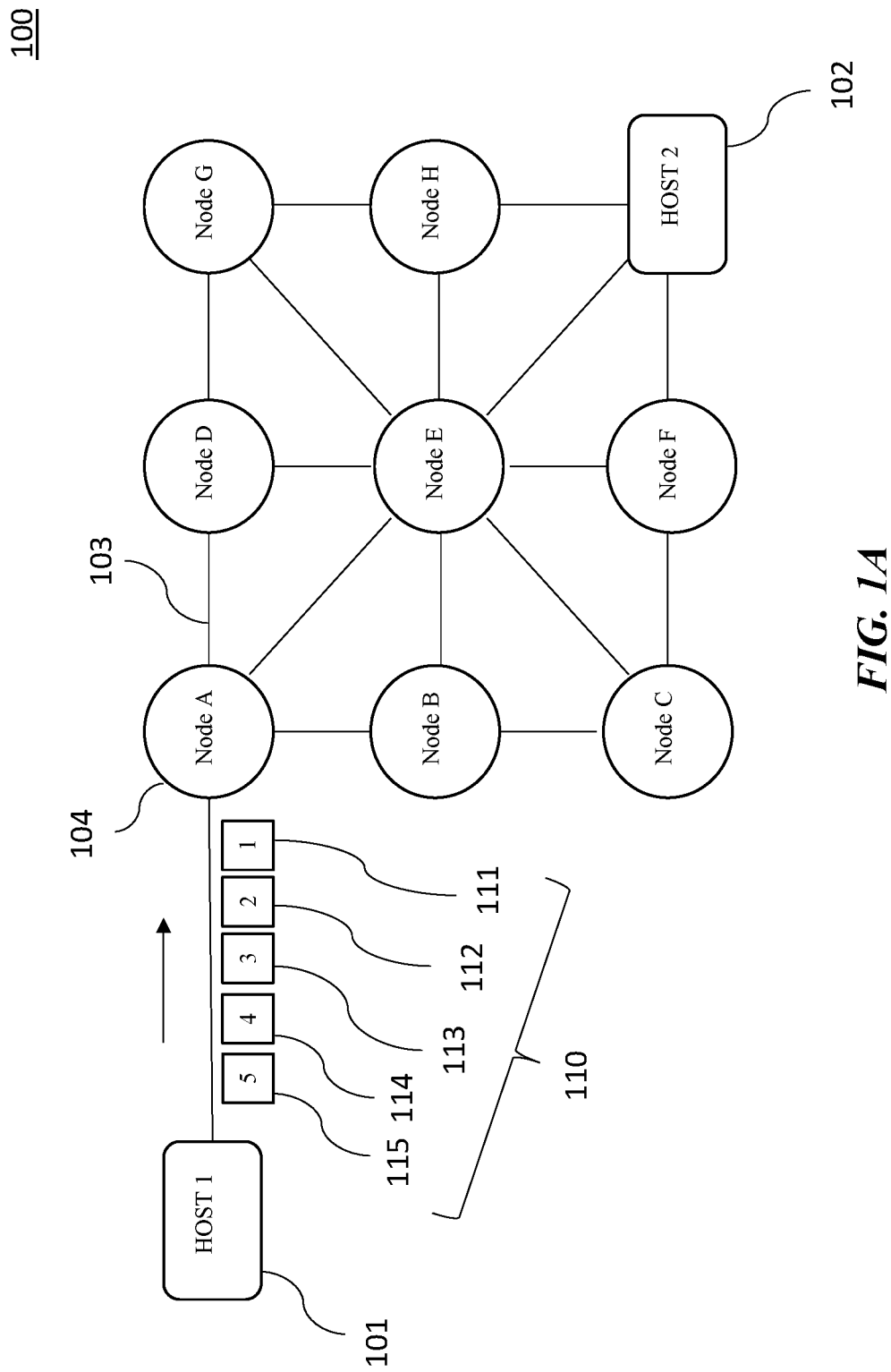
FIGS. 1A-1D show diagrams for exemplary data transmissions using multi-path mesh network systems.
Figure 1B:
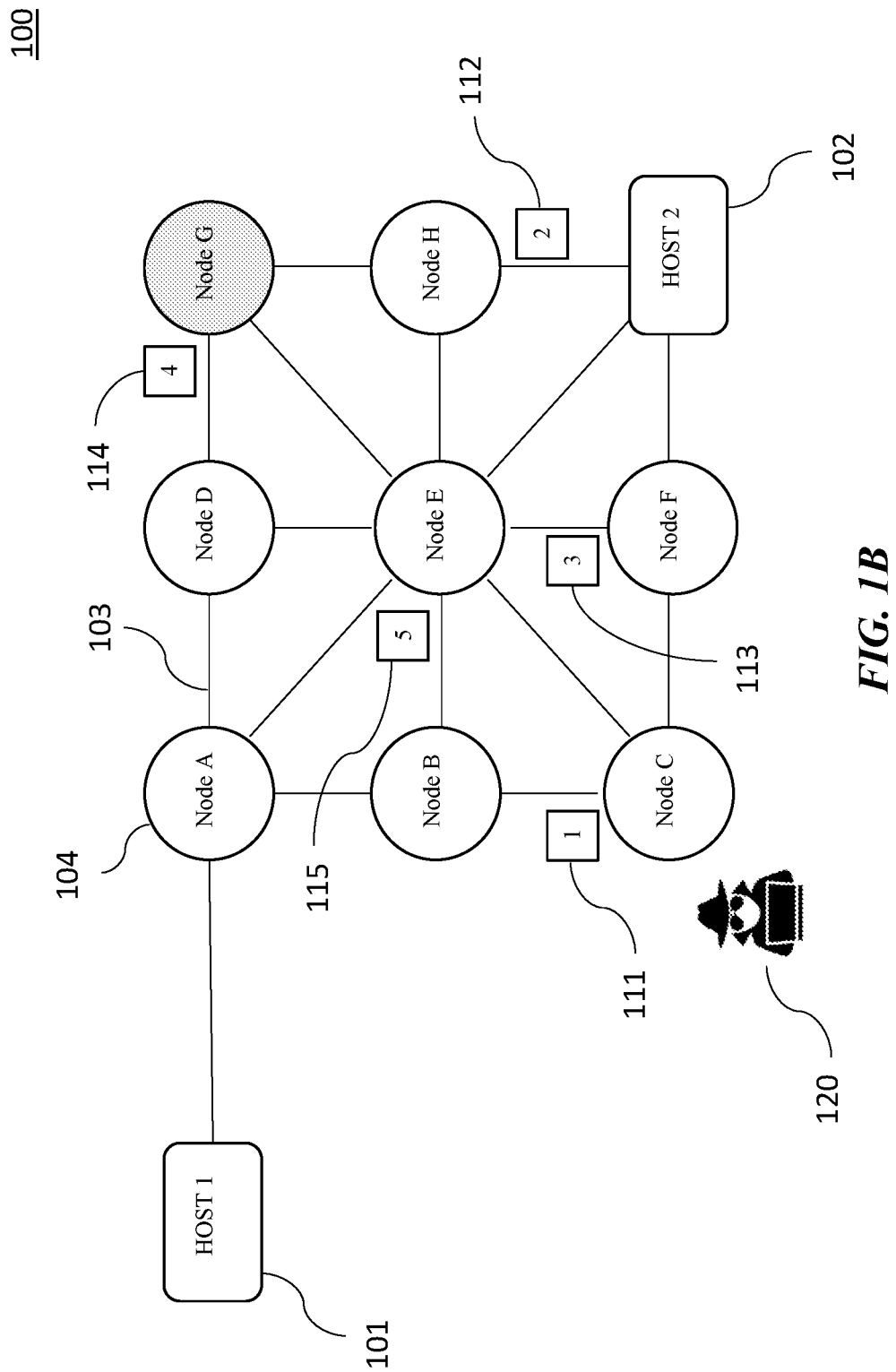
Figure 1C:
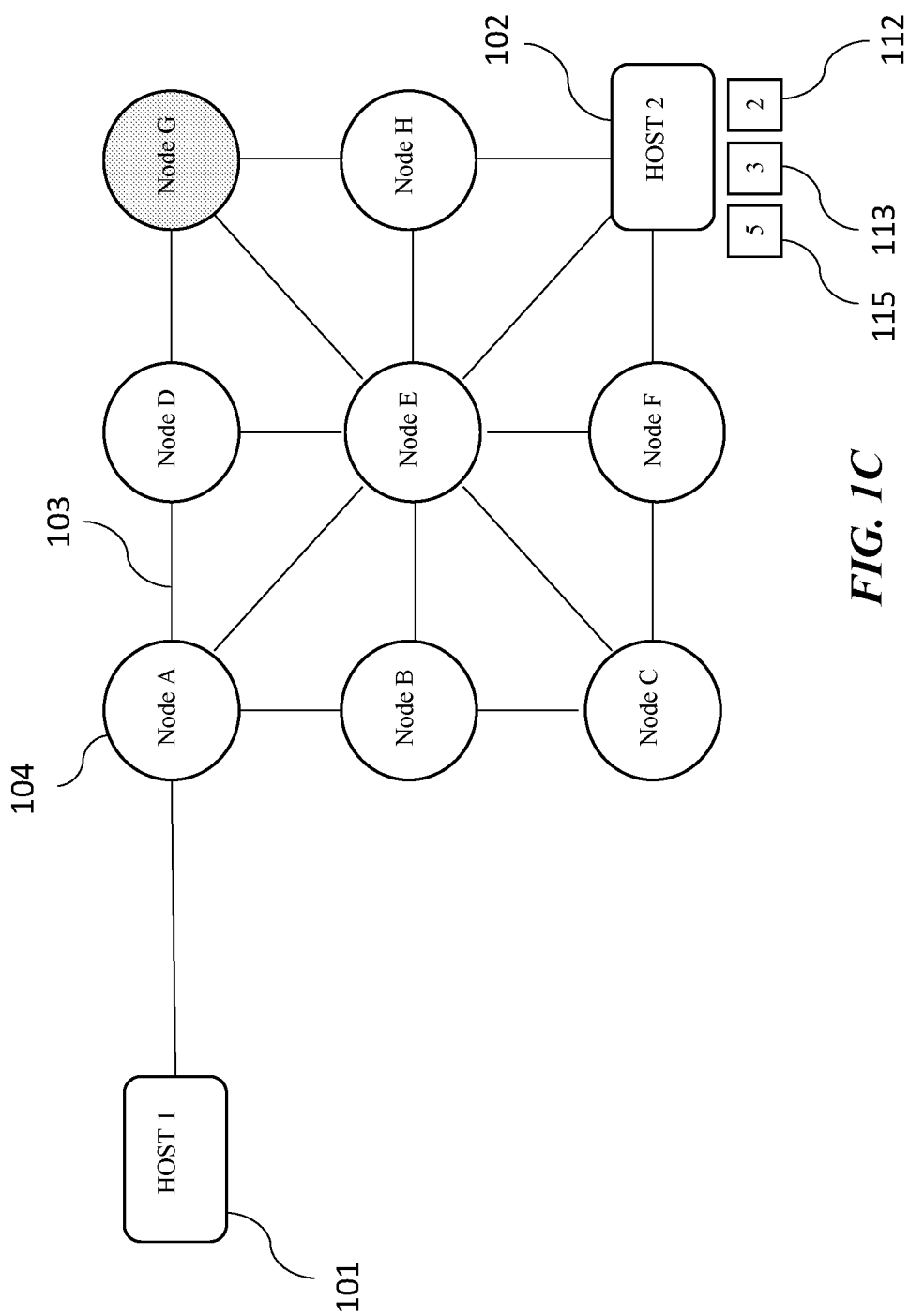

With reference to FIGS. 1A-1D, shown are diagrams for exemplary data transmissions using an embodiment of a multi-path mesh network system 100 of the disclosed invention. An embodiment of the multi-path mesh network system 100 of the disclosed invention includes a first host 101, a second host 102, and a plurality of paths 103 formed by linking communication nodes 104 (nodes A-H). In the exemplary illustration shown in FIG. 1A, data 110 is to be transmitted from the first host 101 to the second host 102. The data 110 is split into copackets 111-115 in the first host 101 before being transmitted from the first host 101. The copackets 111-115 are encoded by a predetermined encoding method, such as Reed Solomon encoding, Low Density Parity Check (LDPC) encoding or turbo codes, which will be described later, or through similar encoding methods. The copackets 111-115 are encoded such that none of the copackets contains any information without a mathematically determined amount of other packets and the decoded algorithm data. The copackets 111-115 contain encoded symbols which can be mathematically assembled to form the original data, whether that be plaintext data or an encoded form of the original plaintext data that is decoded by an entirely separate technique. The copackets are multiple linearly encoded and simultaneously disassembled packets that contain portions of information that are encoded using mathematical algorithms. For example, plaintext data, which is to be sent by the transmitter, is first linearly encoded using a potential variety of linear encoders. The mathematical algorithms used to encode the plaintext data subsequently disassemble the packets into what we call copackets. These copackets independently do not represent any meaningful information as a certain number of these copackets are mathematically required in order to decode the codetext data into meaningful plaintext information. FIGS. 1A-1C show five (5) copackets for description purpose, but the number of copackets is not limited to five and will most likely be in the hundreds. Data 110 can be split to any number of copackets. FIGS. 1A-1C also show eight (8) nodes A-H, but the number of nodes is not limited.

When the nodes A-H are formed in a mesh network between the hosts 101 and 102, combinations of the nodes 104 provide multiple paths 103 that connect the first host 101 to the second host 102. In the system 100, the copackets 111-115 are transmitted to the second host 102 through different paths defined by combinations of the nodes 104.

Each of the copackets includes address headers that include addresses that match addresses of the nodes 104, and the copackets are directed to nodes 104 indicated by the address headers. When a copacket reaches a node, the copacket takes a path for a next node based on the address headers implemented in the copacket. The address headers may be assigned to each copacket while the copackets are encoded or determined in a different OSI layer.

With reference now to FIG. 1B, shown is an exemplary situation in which the copackets 111-115 are transmitted to the host 102 through different paths. For example, the first copacket 111 may take a path formed by nodes A, B, C and F to be transmitted to the second host 102. The second copacket 112 may take a path formed by nodes A, E and H to be transmitted to the second host 102. The third copacket 113 may take a path formed by nodes A, E and F to reach the second host 102. The fourth copacket 114 may take a path formed by nodes A, D, G and H to reach the second host 102. The fifth copacket 115 may take a path formed by nodes A, D and E to reach the second host 102. In this example, it is assumed that the node G fails and the copacket 114 is lost during the transmission and an interceptor 120 intercepts or destroys the copacket 111 while the copacket 111 is transmitted to the node C. In this scenario, because the copacket 111 contains data that can only be decoded into useable information with multiple other copackets and the decoding algorithm, even if the interceptor 120 intercepts the copacket 111, the interceptor cannot recover any information.

With reference now to FIG. 1C, shown is another exemplary situation in which, as a result of the failed node G and the destroyed copacket 111, copackets 112, 113 and 115 are finally received by the second host 102. Embodiments of the system 100 (and method) of the disclosed invention are configured to enable the second host 102 to reassemble the data 110 from the available copackets 112, 113 and 115. The reassembled data at the host 102 has complete information of the data sent from the host 101. For this purpose, embodiments of the system 100 (and method) described herein utilize "m of n" encoding method in which the data (original packet) 110 is encoded into 'n' independent copackets and the recipient utilizes at least 'm' of those 'n' copackets in order to completely reassemble any data 110. In the "m of n" encoding, if at least 'm' copackets among 'n' copackets are received without loss or damage, the original packet can be restored. Embodiments described herein also utilize multiple path mesh network to separately transmit the copackets to the recipient through different paths. Therefore, even if (n-m) copackets are lost or destroyed during transmission, the recipient can successfully reassemble the original data. Moreover, because of the multiple communication paths that respectively transmit copackets, it is practically impossible for an interceptor to obtain any information sent from the host 101 by intercepting some of the communication paths. In the example shown in FIGS. 1A-1C, 'n' is five (5) and 'm' may be three (3). In general, these numbers 'n' and 'm' may be prime numbers and may be usually numbers in the hundreds, and may not be single digits. The single digit numbers five (5) and three (3) are used in this example only for description purpose.

In FIG. 1A-1C, the first host 101 is illustrated transmitting data 110 and the second host 102 receiving the data, but the system 100 is not limited to this configuration, and the hosts 101 and 102 are not so limited. The first host 101 may have the capabilities of both transmitting data and receiving data from other hosts or nodes, and the second host 102 may have the capabilities of both transmitting data and receiving data from other hosts or nodes. When the data is transmitted from the second host 102 to the first host 101, the second host 102 encodes data into copackets, and the copackets may take different multiple paths or the same multiple paths as used by the first host 101.

Embodiments of the system 100 include omnidirectional communication networks, directional communication networks, wired communication network, and combinations thereof. In one embodiment, the multi-path mesh network system 100 utilizes omnidirectional signals. The first host 101 may emit omnidirectional signals carrying copackets 111-115. The copackets 111-115 may be carried by the same omnidirectional signals or different omnidirectional signals. The node 'A' receives the signals carrying copackets 111-115, and directs, for example, the first copacket 111 to the node 'B' and the second copacket 112 to the node 'E'. The node 'A' may direct the copackets via omnidirectional signals. However, it is also possible that the node 'A' may direct the copackets via different types of communication methods, i.e., directional signals or communication cables that are connected to the intended next nodes. When the node 'A' receives the copackets 111-115, the node 'A' refers to the address headers of each copacket and determines the next node to which the copacket is directed. When the node 'A' transmits the copacket 111 and 112, the node 'B' receives a copacket having its corresponding address header that is the first copacket 111 in this example, while the node 'E' receives a copacket having its corresponding address header that is the second copacket 112. In this way, the copackets 111-115 are transmitted to the second host 102 through different paths 103 formed by the multiple nodes 104. In another embodiment, the multi-path mesh network system 100 utilizes wired multi-path networks that may include communication cables. For wired multi-path mesh networks, the same transmission processes as described for the omnidirectional multi-path mesh networks are applied.

Figure 1D:
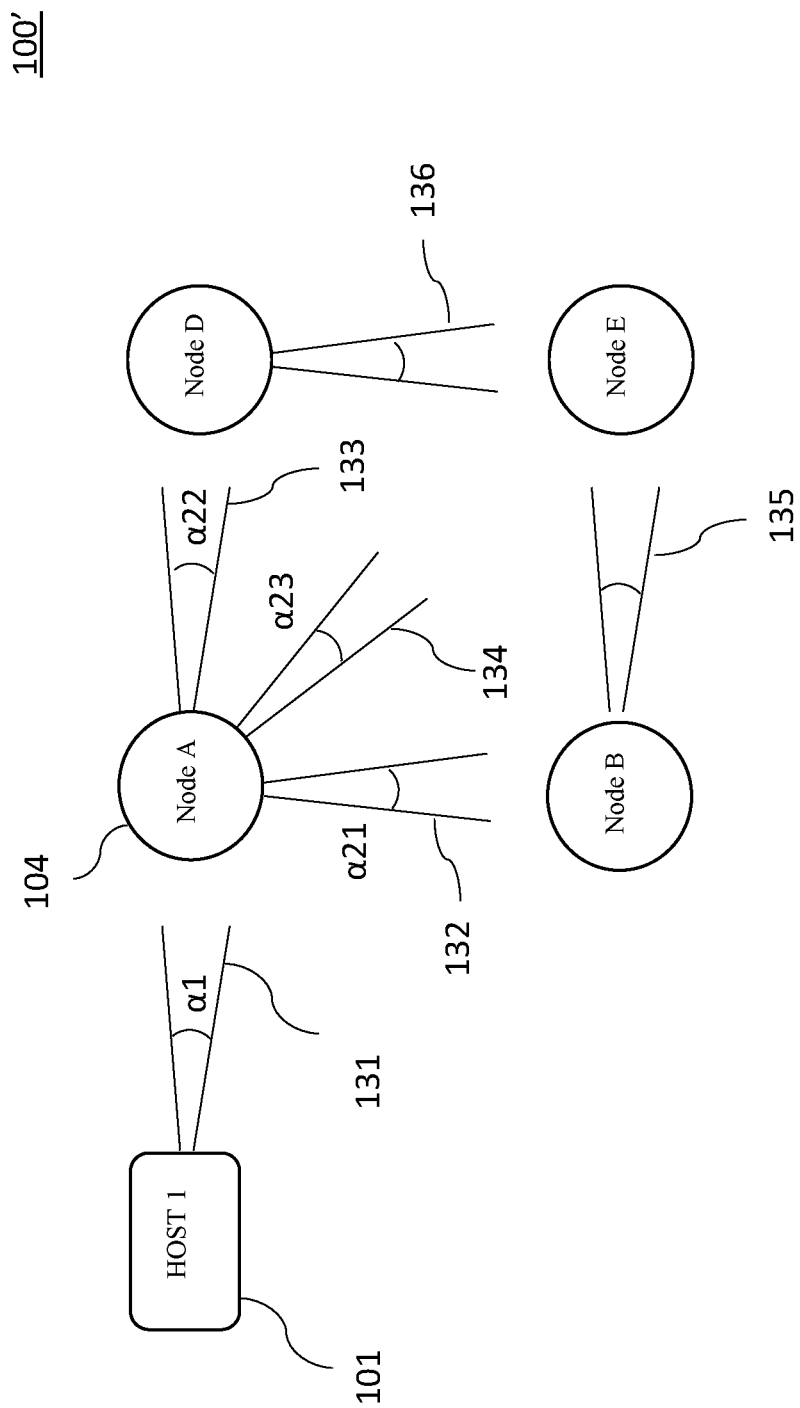

With reference now to FIG. 1D, shown is a diagram of an embodiment in which the multi-path mesh network system 100' utilizes directional beams to transmit copackets from the first host 101. For illustration purpose, only nodes 'A', 'B', 'D' and 'E' are shown in FIG. 1D from the example described above referring to FIGS. 1A-1C. The host 101 emits a beam 131 carrying the copackets 111-115 toward the node 'A'. The node 'A' emits a beam 132 carrying the copacket 111 toward the node 'B', emits a beam 133 carrying the copackets 114 and 115 toward the node 'D', and emits a beam 134 carrying the copackets 112 and 113 toward the node 'E'. The host 101 and the nodes 104 may include transmitters to send directional beams into the intended directions, and receivers to receive beams directed to the host or node from other nodes. The transmitter may include directional antennas. Directional communications enables transmitters to focus most of their energy on an intended receiver. For example, the host 101 focuses its energy on a directional beam 131 directed toward node 'A'. Directional beam 131 may be spread in a beam angle (or beam solid angle) $\alpha 1$. The node 'A' is located within the range of the beam angle $\alpha 1$ to be reached by the beam 131. Copackets 111-115 transmitted from the host 101 are carried by directional beam 131, and is received by the node 'A'. The node 'A' may emit three directional beams 132-134 toward the node 'B', 'D' and 'E', respectively. The nodes 'B', 'D' and 'E' are located within the range of directional beam angles $\alpha 21$, $\alpha 22$ and $\alpha 23$, respectively. The node 'B' emits a directional beam 135 toward the node 'E', and node 'D' emits a directional beam 136 toward the node 'E'. The beam 131 may be a single beam or may include multiple beams.

Each of the beams 132-136 may be a single beam or may include multiple beams. When the beam 131-136 includes multiple beams, copackets may be separately carried by different beams. In this case, each of the multiple beams forms an independent path through which one or more copackets are transmitted.

Figure 2A:
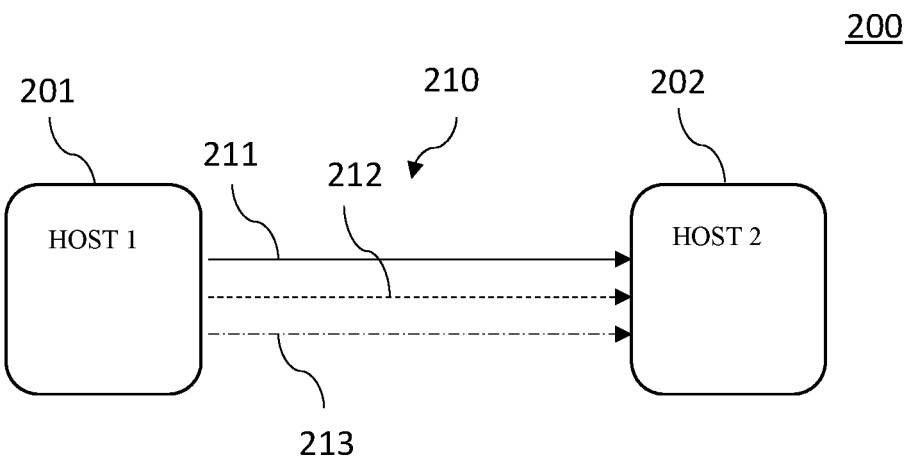
FIGS. 2A-2B show diagrams of embodiments of the multi-path mesh network system that utilizes multiple directional beams to respectively carry copackets.
Figure 2B:
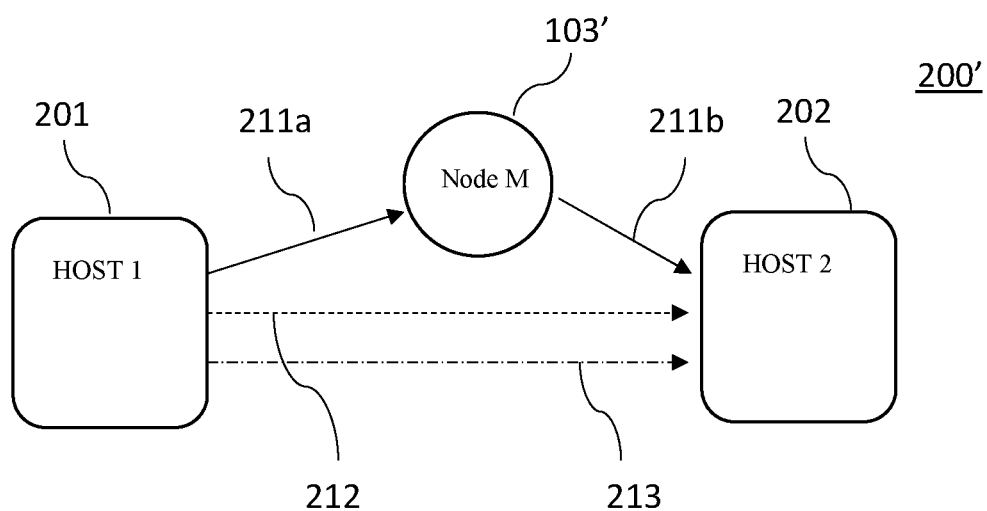

With reference to FIGS. 2A-2B, shown are diagrams of embodiments of a multi-path mesh network system 200, 200' which utilizes multiple directional beams to respectively carry copackets. Referring to FIG. 2A, the multi-path mesh network system 200 of the disclosed invention includes a transmitter node (first host) 201 that emits multiple directional beams and a receiver node (second host) 202 that receives the directional beams emitted from the transmitter node 201. For illustrative purposes, FIG. 2A shows two nodes 201 and 202, but the number of nodes is not limited to two and the multi-path mesh network system 200 may include a plurality of nodes to form directional networks. In FIG. 2A, the first node 201 is illustrated emitting beams and the second node 202 receiving beams, but the system 200 is not limited to this configuration, and the nodes 201, 202 are not so limited. The first node 201 may have the capabilities of both transmitting beams and receiving beams from other nodes, and the second node 202 may have the capabilities of both transmitting beams and receiving beams from other nodes.

Transmitter node 201 includes one or more transmitters (see FIGS. 3A and 4) which emit multiple directional beams 211, 212 and 213 with appropriate waveforms to transmit data packets to the receiver node 202. A data packet, which contains information to be delivered to the receiver node 202, is encoded into multiple copackets as described above referring to FIGS. 1A-1C. None of the copackets have complete knowledge of the data. Each of the copackets is assigned to one of directional beams 211, 212 and 213, and the copackets are respectfully transmitted to the receiver node 202 via the multiple beams. The set 210 of directional beams 211, 212 and 213 are used to transmit the data packet, and all of the directional beams 211, 212 and 213 are directed toward the receiver node 202. FIG. 2A shows three directional beams 211, 212 and 213 for description purpose, but the number of the directional beams is not limited to three. Any number of directional beams can be used for the multi-path mesh network system of the disclosed invention. The multiple directional beams may have different waveforms that have different characteristics such as frequencies, wavelengths and phases. The multiple directional beams 211, 212 and 213 are aimed at the same target node which is receiver node 202 in this example. Directional beams 211, 212 and 213 may be spread with different beam angles, and receiver node 202 is located within the ranges of the directional beam angles to be reached by all of directional beams 211, 212 and 213. Receiver node 202 includes one or more receivers (see FIGS. 3B and 4) that receive directional beams from transmitter node 201 or from other nodes within the directional network.

In the embodiment of the multi-path mesh network system 200, the communication paths are formed by the multiple directional beams 211, 212 and 213, analogy to the different paths 103 shown in FIGS. 1A-1C formed by multiple communication nodes 104. For example, the multiple directional beams 211, 212 and 213 may represent path through nodes ABCF, path through nodes AE, and path through nodes ADGH, respectively. System 200 utilizes the "m of n" encoding method in which the data 110 is encoded into 'n' independent data copackets, and the recipient utilizes at least 'm' of those 'n' copackets in order to reassemble the data 110. When at least 'm' copackets among 'n' copackets are received without loss or damage, the original packet can be restored in the receiver node 202. Embodiments of system 200 utilize multiple beams as multiple paths to separately transmit multiple copackets through different beams provides more reliability and security than a conventional system that uses a single directional beam carrying data between the transmitter and receiver nodes.

Referring to FIG. 2B, shown is another embodiment of the multi-path mesh network system 200' which utilizes multiple directional beams. The difference from the embodiment of FIG. 2A is that one of the directional beams 211 may pass through an intermediary node 103' (node M) with a directional beam 211a from the transmitter node 201 to the intermediary node 103' and a directional beam 211b from the intermediary node 103' to the receiver node 202, while the other directional beams 212 and 213 are directed to the receiver node 202.

Figure 3A:
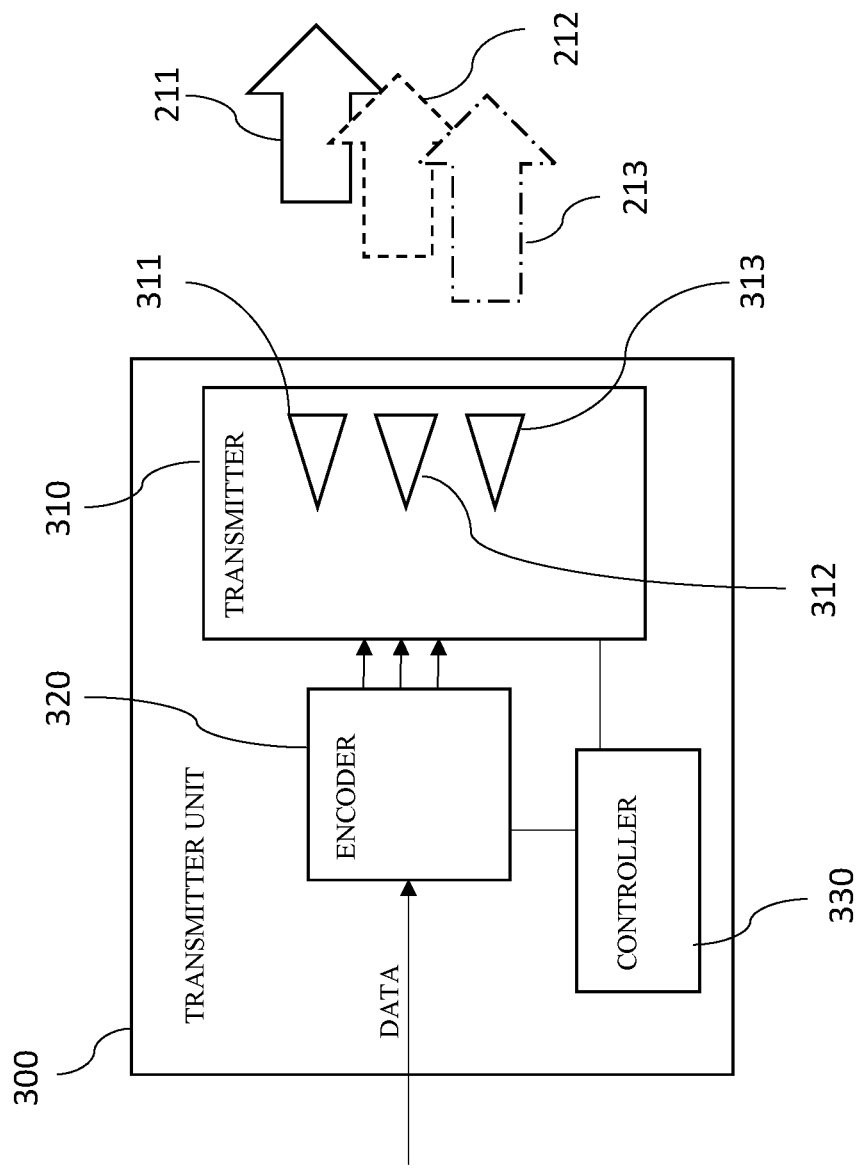
FIGS. 3A-3B show diagrams of a transmitter unit and a receiver unit of the multi-path mesh network system.
Figure 3B:
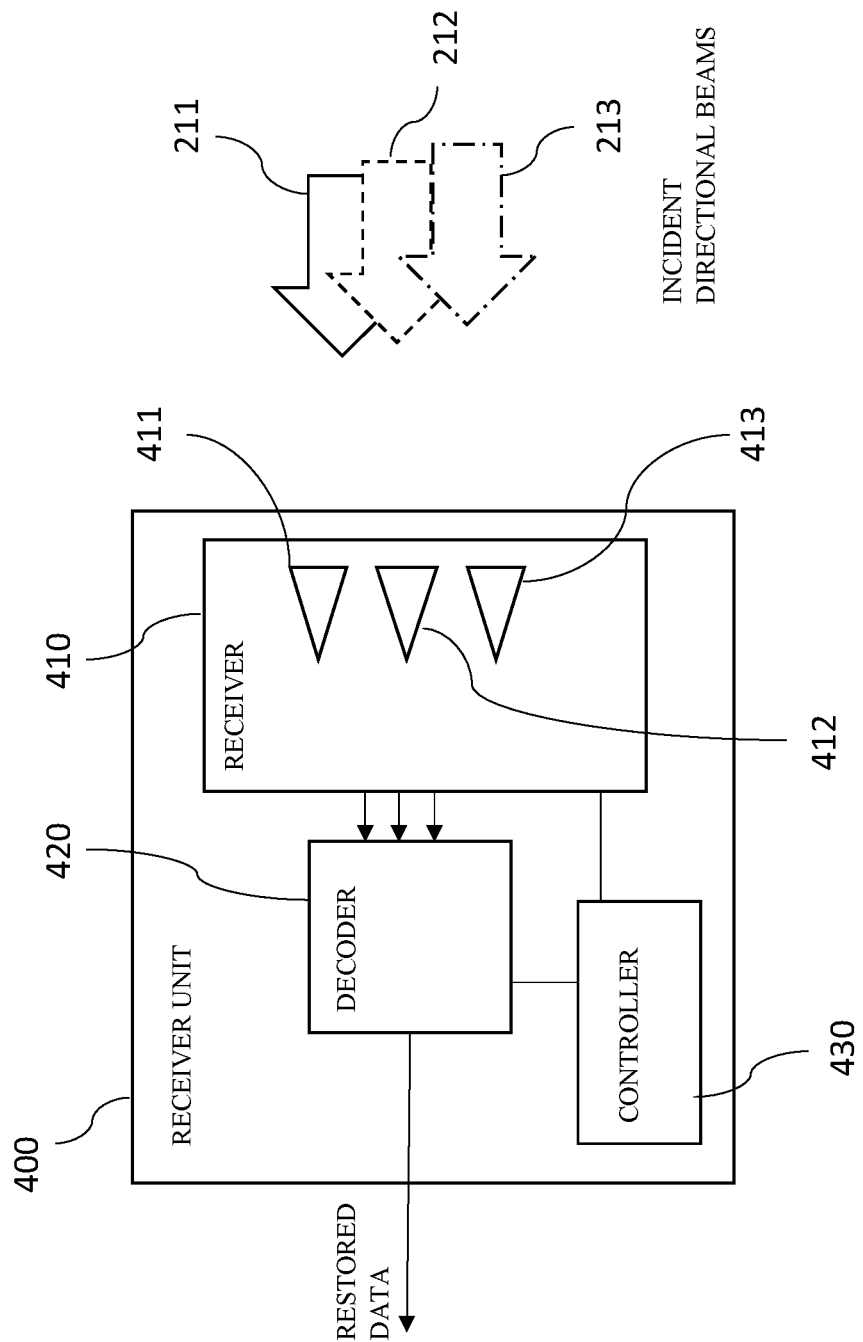

With reference to FIGS. 3A and 3B, shown are diagrams of transmitter unit and receiver unit of an embodiment of multi-path mesh network system 200, which utilizes multiple directional beams to carry copackets. The transmitter unit 300 may be provided in the first node 201 or in both of the first node 201 and the second node 202. The receiver unit 400 may be provided in the second node 202 or in both of the first node 201 and the second node 202.

FIG. 3A shows a transmitter unit 300 that includes a transmitter 310, an encoder 320, and a transmitter controller 330. The transmitter 310 includes one or more sub-transmitters 311, 312 and 313 that emit directional beams with appropriate waveforms to transmit data packets to another node in the network. FIG. 3A shows three (3) sub-transmitters for illustration purpose, but the number of the sub-transmitters is not limited to three (3). The transmitter 310 can have any number of sub-transmitters. The sub-transmitter 311, 312 and 313 may be directional antennas or beam antennas. Unlike the conventional directional communications in which a data packet is transmitted to a target node via a single directional beam, embodiments of system 200 utilize multiple directional beams, which form multiple paths to the target node, to transmit the data packet to the target node. The encoder 320 receives data from an external source, which contains information to be delivered to the target node, and encodes the data. During the data encoding processes, the data is split into a plurality of copackets. The copackets are respectively sent to the sub-transmitters 311, 312 and 313 to be transmitted to the target node. Each beam may carry one copacket.

Known encoding methods in the art may be used by the encoder 320 to encode the packet into copackets. In an embodiment, Reed Solomon codes are used to encode the data. In another embodiment, Low Density Parity Check (LDPC) encodings or turbo codes are used to encode the data. Reed-Solomon codes, LDPC codes and turbo codes provide high reliability and security of data transmission. Similar encoding methods may be used. Upon receiving directional beams, the recipient node processes the received copackets to recreate the original packets. This allows the recipient to reassemble the original packets even if some of the paths fails. This also prevents an interceptor from reassembling the original packets with packets intercepted in a single path. The controller 330 controls the encoder 320 to encode the data and the transmitter 310 to emit multiple directional beams. The controller 330 may include one or more processors and storage media that include instructions to control the transmitter 310 and the encoder 320.

FIG. 3B shows a receiver unit 400 that includes a receiver 410, a decoder 420, and a receiver controller 430. The receiver 410 includes one or more sub-receivers 411, 412 and 413 that properly respond to the directional beams 211, 212 and 213, respectively. FIG. 3B shows three (3) sub-receivers for illustration purpose, but the number of the sub-receivers is not limited to three (3). The receiver 410 can have any number of sub-receivers. The sub-receivers 411, 412 and 413 may be antennas that intercept some of the power of directional beams that carry data packets and produce electric current at their terminals. Each beam 211, 212 or 213 transmitted from the transmitter node carries copackets, as described above. The decoder 420 receives copackets transmitted to the receiver 410 and decodes the copackets, reassembling the original data from the received copackets. Some of the copackets may be damaged or lost during the transmission. In this case, the decoder 420 decodes available copackets among the copackets transmitted by the transmitter node. The receiver controller 430 controls the decoder 420 to decode the copackets and the receiver 410 to receive multiple beams. The receiver controller 430 may include one or more processors and storage media that include instructions to control the receiver 410 and the decoder 420.

Figure 4:
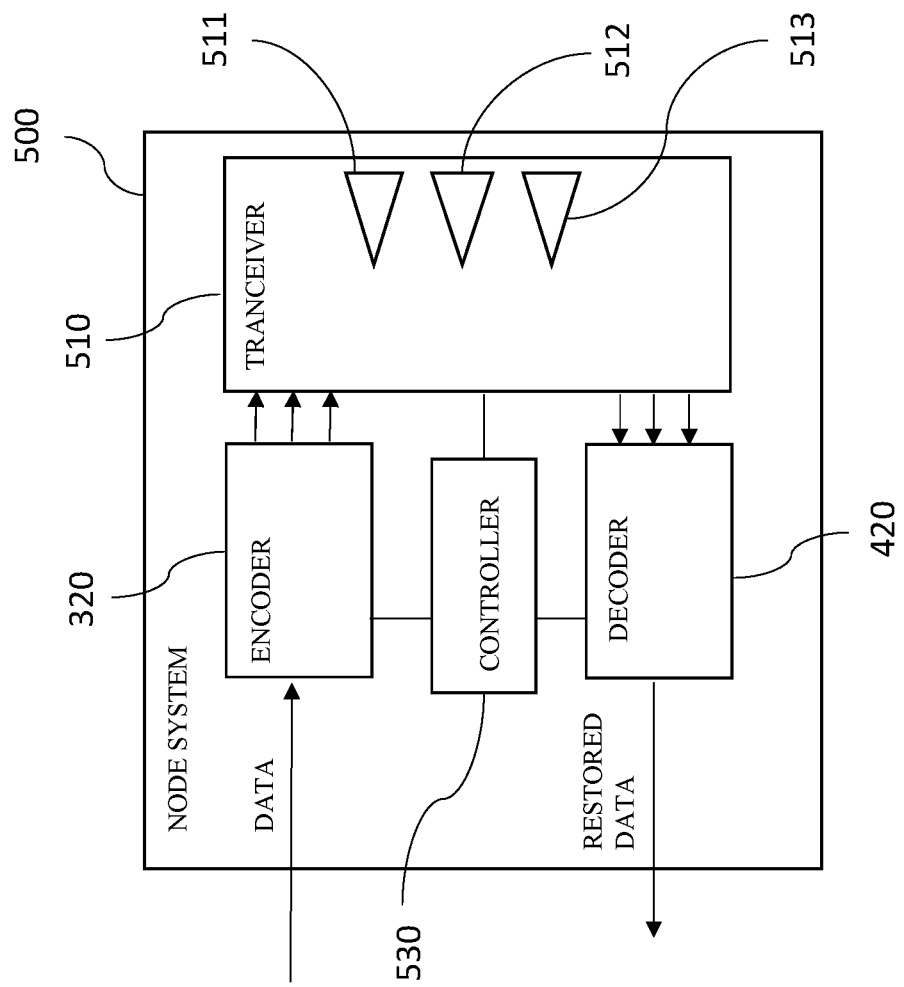
FIG. 4 is a diagram of another embodiment of the node system of the multi-path mesh network system which includes transceivers.

With reference to FIG. 4, shown is a diagram of an embodiment of the node system of the multi-path mesh network system 200, which utilizes multiple directional beams to carry copackets. Node system 500 may be provided in the first node 201, second node 202, or in both of the first node 201 and the second node 202. Embodiments of node system 500 include a transceiver 510 that has the functionality of both transmitting multiple directional beams and receiving corresponding multiple directional beams. The transceiver 510 includes one or more sub-transceivers 511, 512 and 513. Each sub-transceiver has the functionality of transmitting a distinct directional beam carrying a copacket and receiving a corresponding directional beam carrying the copacket. Sub-transceivers 511, 512 and 513 may be directional antennas. Node system 500 includes an encoder 320, a decoder 420, and a controller 530. The functionalities of the encoder 320, and decoder 420 are the same as described above referring to FIGS. 3A and 3B. The controller 530 controls transceiver 510, the encoder 320, and decoder 420. The controller 530 may include one or more processors and storage media that include instructions to control the transceiver 510, the encoder 320 and the decoder 420. Node system 500, however, may be configured to have the transmitter 310 and receiver 410, as shown in FIGS. 3A-3B, instead of the sub-transceiver 510. In this configuration, node system 500 may be configured to have both the transmitter unit 300 and the receiver unit 400.

In an embodiment, Reed Solomon encoding algorithms are used to encode and decode data. The transmitter host processes the data, by using Reed Solomon encoding, to generate Reed Solomon copackets. The receiver host processes the received Reed Solomon copackets to reassemble the original data. The Reed Solomon processing is commonly referred to as "m of n" encoding, i.e., the original packet (data) is encoded into 'n' independent copackets and the recipient must utilize at least 'm' of those 'n' copackets in order to re-assemble the original packet. In other words, any of at least 'm' copackets among 'n' copackets are received without loss or damage, the original packet can be restored. The 'm' and 'n' are chosen to optimize certain communications characteristics. The 'm' may be referred to as a preset optimum number of the "m of n" encoding. The preset number 'm' may be determined mathematically in the encoding algorithm.

For example, assume that n=7 and m=5, and that a transmitting node desires communicating a packet to a recipient. The original packet is split and encoded into seven (7) copackets using Reed Solomon encoding process. Each copackets is transmitted across a distinct path to a distinct recipient or intermediary unit. If the copacket is transmitted to the intermediary unit, the intermediary unit then routes the encoded copacket towards the recipient. In this example, the seven (7) encoded copackets are transmitted to the recipient via seven (7) distinct paths. When the recipient receives the copackets, the receiver unit of the recipient applies Reed Solomon decoding processes to re-assemble the original packet. In this example, the network system is configured such that a minimum of five (5) copackets are required for the re-assembly. If two (2) copackets are disrupt among the seven (7) copackets or if two (2) paths fail or are destroyed, the original packet can be still restored at the recipient, because the recipient receives five (5) copackets which is the minimum number required to restore the original packet. In this way, the multi-path mesh network system of the disclosed invention provides unique, resilient and secure transmission of copackets between node systems by employing the Reed Solomon encoding and decoding processes.

Figure 5:
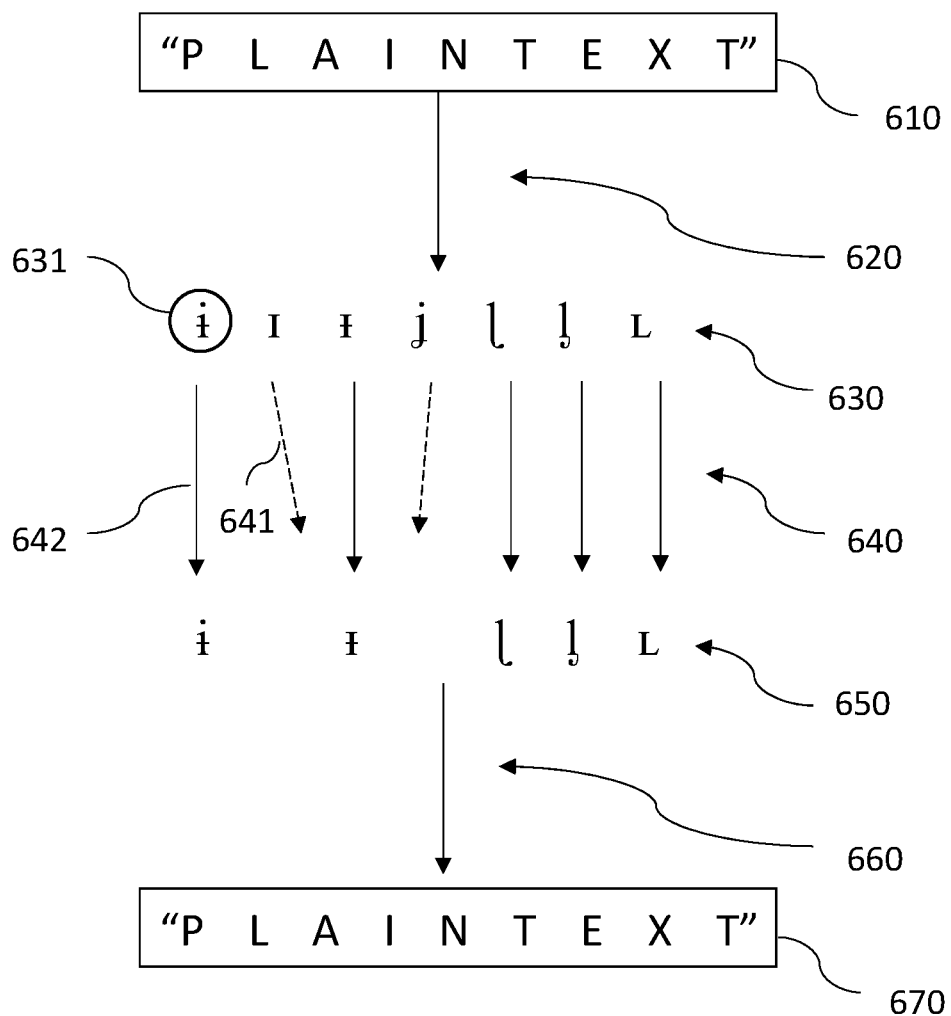
FIG. 5 shows an exemplary diagram illustrating processes of how a data packet is encoded, transmitted, and decoded.

With reference to FIG. 5, shown is an exemplary diagram illustrating processes 600 how data is encoded, transmitted, and decoded according to the system and method of the disclosed invention. For the illustration purpose, suppose that the original data packet includes a plaintext message 610 "PLAINTEXT" to be transmitted. The encoder 320 linearly encodes and disassembles 620 the packet 610 simultaneously into a plurality of copackets 630, by using a linear encoding algorithm such as Reed Solomon, LDPC or turbo codes, from the original message 610. In this example, seven (7) copackets are generated. Any single copacket (for example, copacket 631), which is linearly encoded and disassembled simultaneously from mathematical algorithm, alone does not contain any way to create any form of the original message 610. No individual copacket contains any meaningful (or useable) information, and need "m of n" (5 of 7 in this example) to decode useable data. In other words, none of the copackets contain decodable information of the data. Herein, the useable information may be defined as information that may disclose any part of the data. The useable information may contain decodable information of the data. This technique described above may be different from cryptographic processes, but this technique provides resiliency and security capabilities that are analogous to those provided by encryption.

Each copacket travels through different paths 640. Suppose that some copackets are lost and/or intercepted 641 while the other copackets are successfully transmitted 642. None of the lost or intercepted copackets alone contain any useable information. In this example, five (5) copackets 650 reach the receiver. However, no copacket means anything unless the linear decoding algorithm is used with enough other copackets to reassemble the copackets to the original data packet(s). The decoder 420, by using decoding algorithms such as Reed Solomon, LDPC or turbo codes, linearly decodes and reassembles 660 available copackets 650 to form the original message 610. Through this processes, the plaintext message 610 is successfully decoded 670 by the receiver.

Figure 6A:
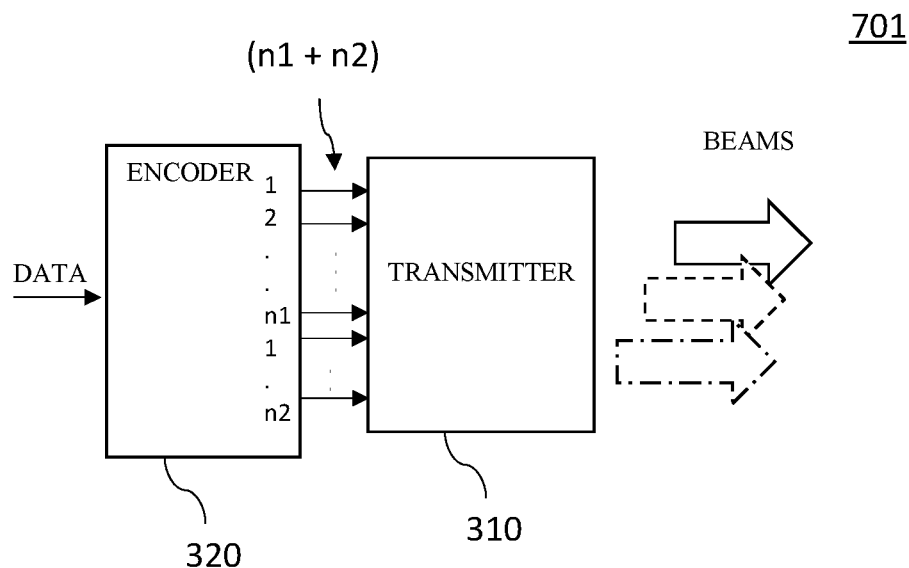
FIGS. 6A-6B show diagrams illustrating Reed Solomon encoding and decoding processes, respectively.
Figure 6B:
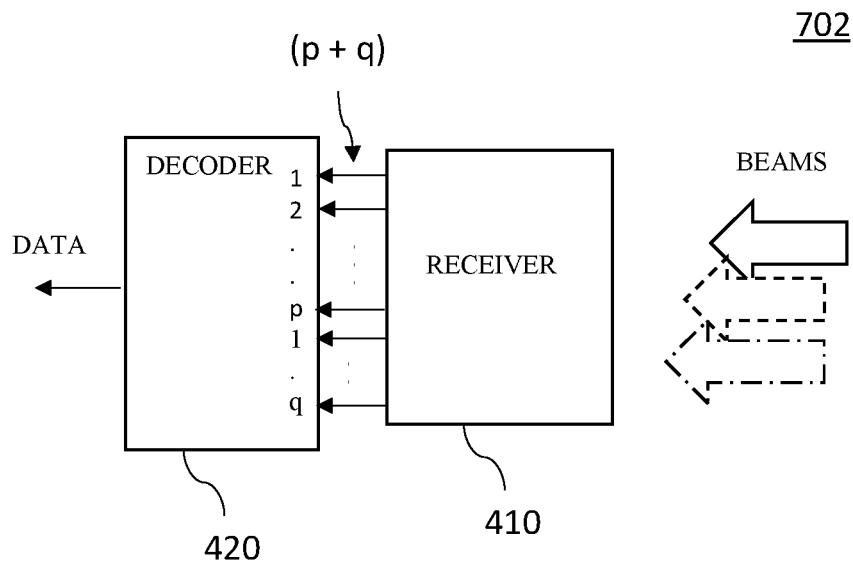

With reference to FIGS. 6A and 6B, shown are exemplary diagrams illustrating Reed Solomon encoding and decoding processes, respectively, adapted into embodiments of the system and method for a multi-path mesh network. The Reed Solomon encoding and decoding processes are illustrated based on the multi-path mesh network system 200 in FIG. 2A which utilizes multiple directional beams for description purpose. However, the same processes are applied to the multi-path mesh network systems 100 that utilizes paths formed by communication nodes that use omnidirectional signals, directional signals or communication wires as shown in FIGS. 1A-1C.

Referring to FIG. 6A, the encoder 320 of the transmitter node 701 receives data from an external data source, and encodes the data. In the encoding processes, the encoder 320 splits the data into multiple copackets, for example 'n1' copackets. The encoder 320 then encodes the 'n1' copackets into an optimal number of 'n2' checksum pieces using the erasure coding technique. Once the copackets and checksum pieces are ready, the (n1+n2) copackets are concurrently and respectfully loaded onto multiple directional beams as copackets. The (n1+n2) corresponds to 'n' and the 'n1' corresponds to 'm' in the "m of n" encoding. The (n1+n2) copackets are respectively carried by (n1+n2) directional beams. For example, the first copacket of 'n' copackets may be carried by the first beam, and the second copacket of 'n' copackets may be carried by the second beam which is selected excluding the first beam to which the first copacket is already assigned. The assignment may be performed randomly. None of the multiple beams carries complete knowledge of the data, because each beam is carrying only a copacket or a checksum piece. As a result, even though some of directional beams are intercepted, any knowledge of the data cannot be disclosed to the interceptor. This method can effectively defend the data against data breaches that can occur when the data is carried by a single beam.

Referring to FIG. 6B, when recipient node 702 receives the multiple beams that are transmitted from transmitting node 701, recipient node 702 may try to receive and re-assemble the (n1+n2) copackets from the multiple beams concurrently. If all copackets are available, they can be efficiently re-assembled into the original data. However, in the case that one or more beams cannot be received or are altered damaging the copackets or checksum pieces carried by directional beams, recipient node 702 tries to receive all available copackets (for example, 'p' available copackets) and available checksum pieces (for example, 'q' available checksum pieces). As long as p+q≥m, the decoder 420 can successfully decode the copackets using the available data and checksum pieces due to the erasure coding technique, and the original data can be re-assembled. In the Reed Solomon encoding technique, the checksum pieces serve as the redundant information of the original data, which makes this method reliable and fault tolerant.

In general, the erasure codes use mathematical functions to convert original data into copackets, and to decode the copackets in order to recover the data when some of them are lost. The Reed Solomon algorithm encodes all 'n1' copackets with 'n2' checksum pieces. In this case, out of (n1+n2) pieces, any 'n1' pieces among the (n1+n2) copackets are enough to recover the original 'n1' copackets. If the (n1+n2) copackets are respectfully carried by (n1+n2) beams, the Reed Solomon algorithm can be used to handle 'n2' failures among the (n1+n2) beams. If the multi-path mesh network system is configured with Reed Solomon codes utilizing "m of n" encoding, the system may have (n1+n2) directional beams to respectively carry the 'n1' copackets and 'n2' checksum pieces. In other words, a number of the directional beams may be greater than or equal to a sum of a number of the copackets and a number of the checksum copackets.

In another embodiment, Low Density Parity Check (LDPC) codes can be used to encode and decode data. LDPC codes are a type of linear block error correction codes, assembled using sparse parity-check matrices using Tanner or bipartite graphs. The LDPC codes use 'n' variable nodes connected to (n−k) constraint nodes to form an (n, k) linear code. For example, if n=6 and k=3, there are eight (8) possible 6-bit strings corresponding to a set of valid codewords. The 6-bit code fragments represent a 3-bit message. Redundancy is used in a similar manner to Reed Solomon encoding where not all of the bits of the codeword must be recovered to decode the 3-bit message, and this is a simple (6, 3) linear code. To decode data, a binary erasure type decoding is used by the receiver similar to the Reed Solomon encoding. This shows, similar to Reed Solomon encoding, how the message can be decoded by the receiver without requiring the entire message to be successfully transmitted through the mesh. Similarly, even if an adversary intercepts one or two of the copackets traveling through the mesh, the adversary would not have enough information to determine what the original message is. The receiver has the security and resiliency provided by the copackets traveling through separate paths in the mesh network. As more complex mathematics is generally implemented on high-power processors with long lock lengths, it is possible to pre-calculate the output bit based upon predetermined input bits to form a lookup table which would also allow use on relatively low-power microprocessors with the only cost being the memory to store the lookup table.

LDPC is a type of turbo code. There are many different instances of turbo codes, using different component encoders, input/output ratios, interleavers, and puncturing patterns. Turbo codes are also forward error correction (FEC) scheme similar to Reed Solomon and LDPC, and can be used to decode partially received codewords to decode the original message with the typical application being in noisy communication channels and the multi-path mesh network system of the disclosed invention.

Figure 7:
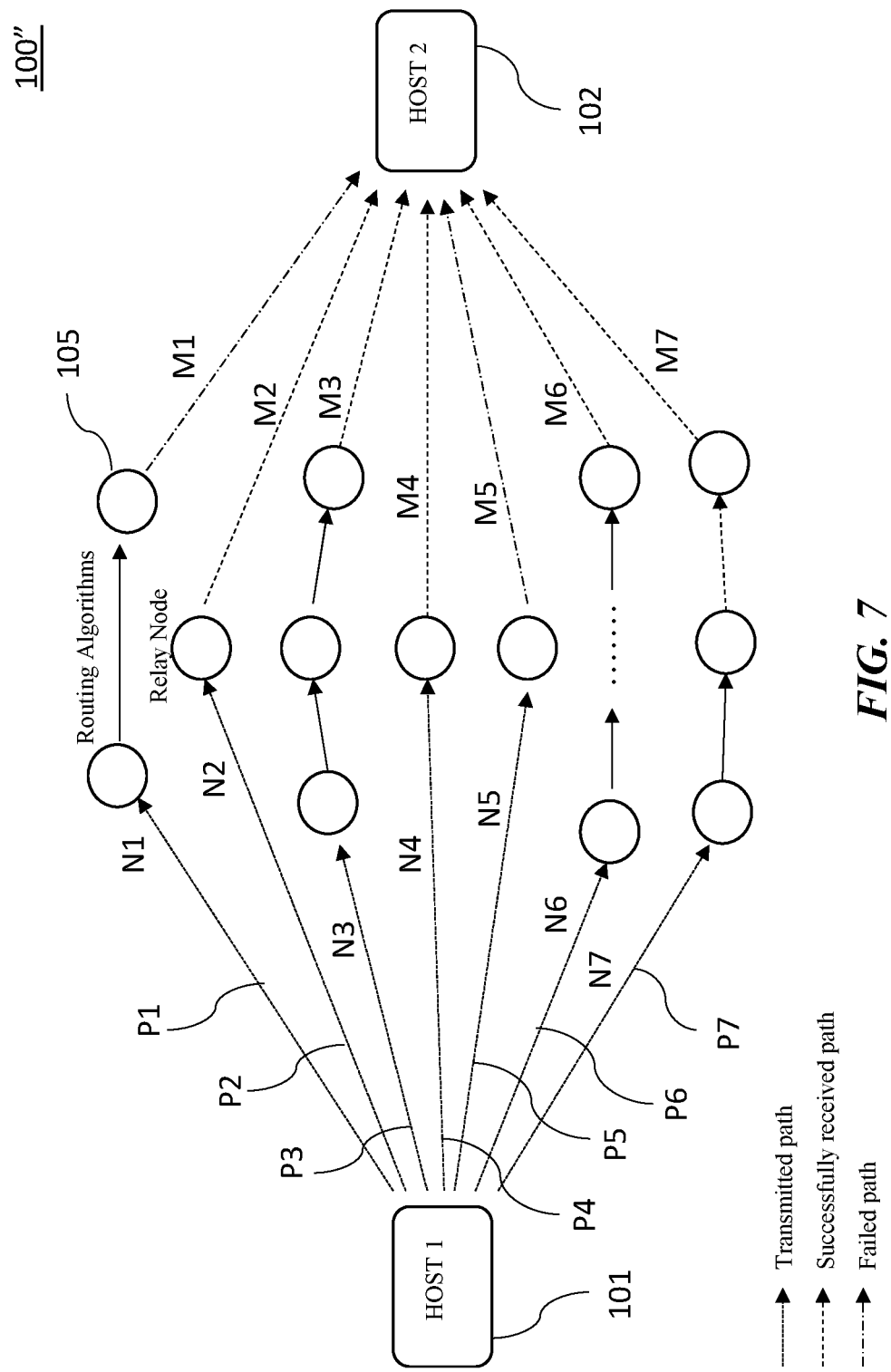
FIG. 7 shows a diagram illustrating the multi-path mesh network system which utilizes Reed Solomon encoding in the transport layer (layer 4) of the Open Systems Interconnection (OSI).

With reference to FIG. 7, shown is a diagram illustrating an embodiment of the multi-path mesh network system 100" which utilize Reed Solomon encoding in transport layer (layer 4) of Open Systems Interconnection (OSI). For illustration purpose, FIG. 7 shows seven (7) encoded copackets N1-N7. The copackets N1-N7 are transmitted to the recipient host 102 from the transmitter host 101 via different paths P1-P7, respectively. The paths P1-P7 may include relay nodes 105 to relay the copackets on the paths to other nodes or recipient host 102. There may be routing algorithms between the relay nodes 105. Data is encoded in OSI layer 4 (transport layer) instead of layer 1 (physical layer) or layer 2 (data link layer). In the copackets, Quality of Service (QoS) bit of the copackets control the data transmission such that layer 4 instructs layer 3 which path the copacket is to be sent. In FIG. 7, five (5) copackets M2-M4 and M6-M7 are successfully transmitted, but two (2) copackets M1 and M5 are lost. In this example of "5 of 7" encoding scheme, even if copackets M1 and M5 are lost, the original data can be reassembled in the recipient host 102. However, if more than two (2) copackets are lost in the transmission, the data cannot be reassembled.

Figure 8:
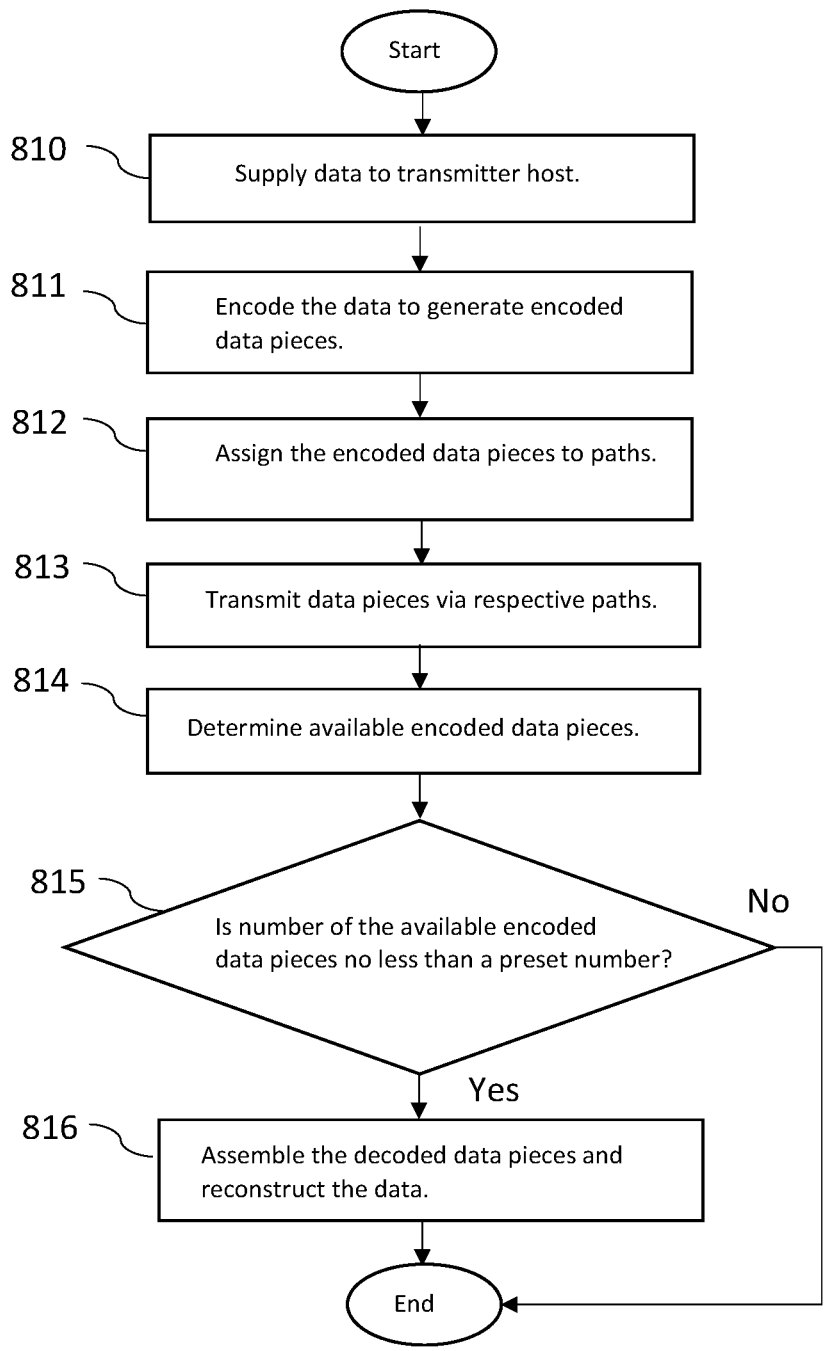
FIG. 8 shows a workflow diagram for performing data transmission by using the multi-path mesh network system.

With reference to FIG. 8, shown is a workflow diagram of an embodiment of a method 800 for performing data transmission by using a multi-path mesh network system. Data is supplied to an encoder of a transmitter host, block 810. The encoder encodes the packets to generate a plurality of copackets, block 811. In the encoding process, the data is split into copackets. In embodiments, the encoder encodes 811 copackets using Reed Solomon algorithms. However, other encoding schemes such as LDPC and turbo codes may be used to encode the copackets. The copackets are respectively assigned to a plurality of paths, block 812. In the assigning process 812, address headers may be added to the copackets. The copackets travel the paths indicated by the address headers. If there are 'n' copackets, at least 'n' paths may be required. However, it is also possible to have less than 'n' paths. If the number of paths is less than the number of copackets, some of the copackets may travel through the same paths. In an embodiment, the copackets may be randomly assigned to the paths. For example, the first copacket of 'n' copackets may be assigned to the first path which is randomly selected, and the second copacket of 'n' copackets may be assigned to the second path which is randomly selected excluding the first path to which the first copacket is already assigned. A transmitter host transmits the copackets via respective paths, block 713, towards a recipient host. When the copackets are received by the recipient host, the recipient host determines available copackets among the transmitted copackets, block 814. If the number of the available copackets is no less than a preset optimum number, block 815, the recipient host decodes the available copackets to generate decoded packets and assembles the decoded packets to reassemble the original data, block 816.

The terms and descriptions used herein are set forth by way of illustration only and are not meant as limitations. Those skilled in the art will recognize that many variations are possible within the spirit and scope of the invention and the embodiments described herein.

What is claimed is:

1. A network system for multi-path mesh network communications, comprising:
    a first host comprising:
        an encoder configured to receive data from an external source, to encode the data by linearly encoding, and to simultaneously disassemble the data into a plurality of copackets, wherein the disassembled data contained in the copackets are computationally independent to each other and none of the copackets individually contains useable information of the data and ability to decode any part of the data; and
        a transmitter coupled to a plurality of communication paths, wherein the transmitter is configured to respectively transmit the copackets through the communication paths; and
    a second host coupled to the communication paths and comprising:
        a receiver configured to receive the copackets transmitted through the communication paths from the transmitter of the first host; and
        a decoder configured to decode available copackets among the copackets transmitted from the transmitter and to reassemble the data from the available copackets when a number of the available copackets is no less than a preset number, and wherein the reassembled data has the complete information of the data originally transmitted.

2. The network system of claim 1 wherein none of the copackets disassembled from the data is transmitted through a same communication path as other copackets.

3. The network system of claim 1 wherein the encoder is configured to utilize an 'm' of 'n' encoding method in which the data is encoded into 'n' copackets and the second host utilizes at least 'm' of the 'n' copackets in order to completely reassemble the data, wherein the 'm' and 'n' are greater than zero.

4. The network system of claim 1 wherein the encoder encodes the data by using one selected from a group consisting of Reed Solomon codes, low density parity check codes, and turbo codes.

5. The network system of claim 1 wherein the encoder is configured to add addressing headers or routing headers to the copackets to direct the copackets through the communication paths.

6. The network system of claim 1 wherein the transmitter transmits the copackets via one or more selected from a group consisting of omnidirectional wireless signals, directional wireless signals, and communication wires including communication cables.

7. The network system of claim 1 wherein the communication paths comprise mesh network schemes.

8. The network system of claim 1 wherein the communication paths comprise one or more communication nodes that are coupled to the first and second hosts.

9. The network system of claim 8 wherein the communication nodes are configured to direct the copackets to next communication nodes.

10. The network system of claim 8 wherein the communication nodes are configured to direct the copackets via one or more selected from a group consisting of omnidirectional signals, directional signals, and communication wires including communication cables.

11. The network system of claim 1 wherein the data is encoded in an Open Systems Interconnection (OSI) transport layer (layer 4).

12. A method for performing multi-path mesh network communications, comprising:
    supplying data to an encoder from an external source;
    linearly encoding the data and simultaneously disassembling the data, via the encoder, into a plurality of copackets, wherein the disassembled data contained in the copackets are computationally independent to each other and none of the copackets individually contains useable information of the data and ability to decode any part of the data;
    transmitting the copackets, via a transmitter of a first host, to a second host through a plurality of communication paths;
    receiving the copackets, via a receiver of the second host, transmitted through the communication paths; and
    decoding available copackets, among the transmitted copackets, to reassemble the data from the available copackets, when a number of the available copackets is no less than a preset number, and wherein the reassembled data has the complete information of the data originally transmitted.

13. The method of claim 12 wherein none of the copackets disassembled from the data is transmitted through a same communication path as other copackets.

14. The method of claim 12 wherein the linearly encoding the data and simultaneously disassembling the data comprise utilizing an 'm' of 'n' encoding method in which the data is encoded into 'n' copackets and the second host utilizes at least 'm' of the 'n' copackets in order to completely reassemble the data, wherein the 'm' and 'n' are greater than zero.

15. The method of claim 12 wherein the linear encoding the data comprises encoding the data by using one selected from a group consisting of Reed Solomon codes, low density parity check codes, and turbo codes.

16. The method of claim 12 further comprising adding addressing headers or routing headers to the copackets to direct the copackets through the communication paths.

17. The method of claim 12 wherein the transmitting the copackets comprises transmitting the copackets via one or more selected from a group consisting of omnidirectional signals, directional signals, and communication wires including communication cables.

18. The method of claim 12 wherein the communication paths comprise mesh network schemes.

19. The method of claim 12 wherein the communication paths comprise one or more communication nodes that are coupled to the first and second hosts, and the communication nodes are configured to direct the copackets to next communication nodes.

20. The method of claim 19 wherein the communication nodes are configured to direct the copackets via one or more selected from a group consisting of omnidirectional signals, directional signals, and communication wires including communication cables.

\* \* \* \* \*